United States Patent
Geiss (10) Patent No.: US 12,028,076 B1
(45) Date of Patent: Jul. 2, 2024

(54) CIRCUIT AND METHOD FOR DETERMINING A DELAY OF A DELAY CIRCUIT

(71) Applicant: Renesas Electronics America Inc., Milpitas, CA (US)

(72) Inventor: Richard Ernest Geiss, Milpitas, CA (US)

(73) Assignee: Renesas Electronics America Inc., Milpitas, CA (US)

( * ) Notice: Subject to any disclaimer, the term of this patent is extended or adjusted under 35 U.S.C. 154(b) by 0 days.

(21) Appl. No.: 18/174,823

(22) Filed: Feb. 27, 2023

(51) Int. Cl.
  *H03K 5/135* (2006.01)
  *H03K 5/00* (2006.01)

(52) U.S. Cl.
  CPC ... *H03K 5/135* (2013.01); *H03K 2005/00019* (2013.01)

(58) Field of Classification Search
  None
  See application file for complete search history.

(56) References Cited

U.S. PATENT DOCUMENTS

| | | | |
|---|---|---|---|
| 7,460,969 B2 * | 12/2008 | Suda | H03K 5/06 702/89 |
| 2019/0296724 A1 * | 9/2019 | Hirashima | H03K 7/08 |

* cited by examiner

*Primary Examiner* — Cassandra F Cox
(74) *Attorney, Agent, or Firm* — SCULLY, SCOTT, MURPHY & PRESSER, P.C.

(57) ABSTRACT

A circuit and corresponding method for determining a delay are presented. The circuit includes a delay circuit, a feedback circuit and a controller. The delay circuit receives an input signal having an input edge and provides an output signal having an output edge. The input edge and the output edge are separated by a delay. The feedback circuit causes the delay circuit to generate a series of consecutive output pulses. The controller sets the delay to a first delay value and measures a first period of output pulses; sets the delay to a second delay value and measure a second period of output pulses. The controller then calculates the delay based on a difference between the first period and the second period.

20 Claims, 6 Drawing Sheets

CIRCUIT AND METHOD FOR DETERMINING A DELAY OF A DELAY CIRCUIT

TECHNICAL FIELD

The present disclosure relates to a circuit and corresponding method for determining a delay of a delay circuit.

BACKGROUND

Conventional delay measurement involves some method of directly or indirectly measuring the time between the trigger input event of the delay element, and the output event of the delay element.

Direct time measurement requires a time measurement mechanism with smaller timesteps than the delay of the circuit being measured. This requires very high-speed clocks which limits its accuracy and resolution. Direct time measurements suffer from any time errors in the input trigger event or output event of the circuit being measured. There is also a measurement error due to the resolution of the known clock period that is measuring the circuit under test, since only integer periods are counted. This gives an error of +/−1 period of the known clock.

Indirect time measurements can be made by implementing a circuit that is triggered by the input of the circuit being measured, as well as the output of the circuit being measured. An example of this might be a circuit that uses a fixed current into a capacitor to start a voltage ramp at the input event, and stop the voltage ramp at the output event, and then measure the voltage change that occurred. This allows the voltage measurement to be done at a slower rate than the delay itself. Indirect time measurements are limited by the errors of the voltage ramp and voltage measurement elements.

It is an object of the disclosure to address one or more of the above mentioned limitations.

SUMMARY

According to a first aspect of the disclosure there is provided a method of determining a delay of a delay circuit, the method comprising
providing a delay circuit configured to receive an input signal having an input edge and to provide an output signal having an output edge, wherein the input edge and the output edge are separated by a delay;
coupling the delay circuit to a feedback circuit to cause the delay circuit to generate a series of consecutive output pulses;
setting the delay to a first delay value and measuring a first period of output pulses;
setting the delay to a second delay value and measuring a second period of output pulses; and
calculating the delay based on a difference between the first period and the second period.

For instance, the delay may be a duration between the end of an input pulse and the start of an output pulse.

Optionally, the feedback circuit is configured to generate a feedback signal as an input to the feedback circuit, wherein the feedback signal has a feedback pulse having a first edge and a second edge causing the series of consecutive output pulses, wherein the first edge of the feedback pulse has a reversed polarity compared to the input edge.

Optionally, measuring the first and second periods of output pulses comprises setting a target number of output pulses; counting a first number of reference counts for the target number of output pulses at the first delay value; counting a second number of reference counts for the target number of output pulses at the second delay value.

Optionally, the first delay value is a minimum delay value and the second delay value is a delay value selected between the minimum delay value and a maximum delay value or equal to the maximum delay value.

For instance, when the second delay value is a maximum delay value, the delay is a full-scale delay of the delay circuit.

Optionally, the method comprises comparing the calculated delay with a target value to obtain a difference measurement.

Optionally, the method comprises adjusting the delay iteratively to reduce the difference measurement. For instance the steps of adjusting the delay and performing a set of measurements to obtain an updated value of the full-scale delay and comparing the updated value with the target value may be repeated iteratively to reduce the difference measurement.

Optionally, the method comprises calculating a correction coefficient to obtain a corrected delay value and setting the delay to the corrected delay value.

According to a second aspect of the disclosure, there is provided a circuit comprising
a delay circuit configured to receive an input signal having an input edge and to provide an output signal having an output edge, wherein the input edge and the output edge are separated by a delay;
a feedback circuit adapted to cause the delay circuit to generate a series of consecutive output pulses;
and a controller configured to set the delay to a first delay value and measure a first period of output pulses; to set the delay to a second delay value and measure a second period of output pulses; and to calculate the delay based on a difference between the first period and the second period.

Optionally, the controller is configured to set a target number of output pulses; count a first number of reference counts for the target number of output pulses at the first delay value; count a second number of reference counts for the target number of output pulses at the second delay value.

Optionally, the controller comprises an adjuster circuit and a sensor circuit, the adjuster circuit being configured to set the delay to the first or the second delay value and initiate the sensor circuit to count the first number of reference counts count for the first delay or the second number of reference counts for the second delay.

Optionally, the sensor circuit comprises a reference counter and a delay counter coupled to a counter controller; wherein the delay counter is configured to count the target number of output pulses, and wherein the reference counter is configured to provide the first and second number of reference counts.

Optionally, the delay counter is configured to count the target number of output pulses and to send an end signal to the counter controller; and wherein upon receipt of the end signal the counter controller is configured to generate a stop signal to stop the reference counter and to send the number of reference count from the reference counter to the adjuster.

Optionally, the adjuster circuit comprises a calculator configured to calculate the first period of the output signal using the first number of reference counts; and to calculate the second period of the output signal using the second number of reference counts; and to calculate the difference between the first period and the second period.

Optionally, the first delay value is a minimum delay value and the second delay value is a delay value selected between the minimum delay value and a maximum delay value or equal to the maximum delay value.

Optionally, the calculator is configured to compare the calculated delay with a target value to obtain a difference measurement.

Optionally, the adjuster circuit is configured to generate an adjustment signal to adjust the delay, and to adjust the delay iteratively to reduce the difference measurement.

Optionally, the adjustor circuit is configured to calculate a correction coefficient to obtain a corrected delay value and to set the delay to the corrected delay value.

Optionally, the feedback circuit is configured to provide a feedback signal based on the output signal, the circuit comprising a selector configured to select the input signal between an external signal and the feedback signal. For instance the selector may comprise a multiplexer or a switch.

Optionally, the feedback circuit comprises a memory device coupled to the delay circuit in a feedback loop.

Optionally, the feedback circuit comprises a flip-flop having a reset input coupled to the selector via a first delay, a clock input coupled to the output of the delay circuit via a second delay, and an output coupled to selector.

Optionally, the circuit comprises a fractional divider configured to provide the external signal to the selector.

The options described with respect to the first aspect of the disclosure are also common to the second aspect of the disclosure.

DESCRIPTION OF THE DRAWINGS

The disclosure is described in further detail below by way of example and with reference to the accompanying drawings, in which.

DESCRIPTION

Figure 1:
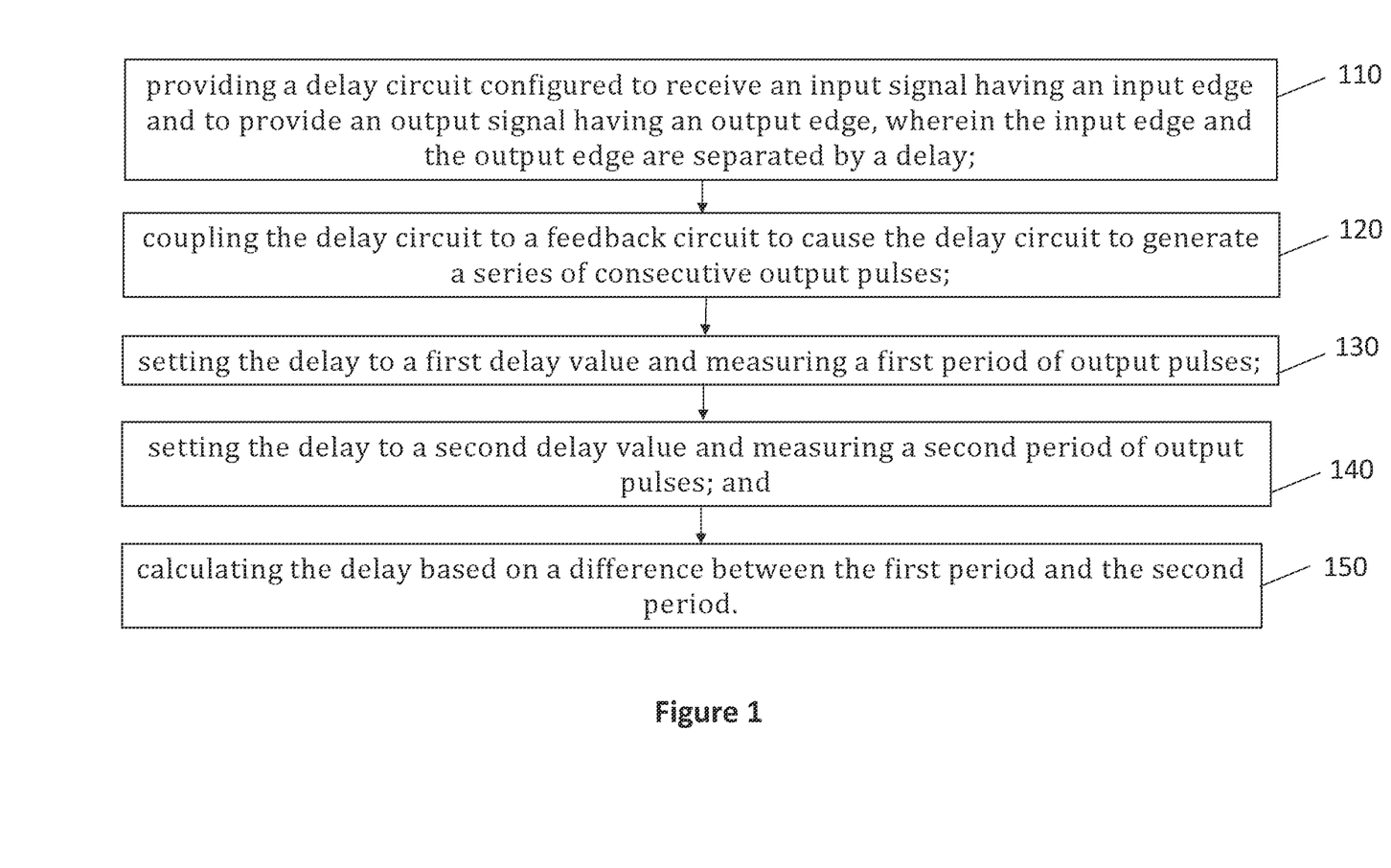
FIG. 1 is a flow chart of a method for determining a delay of a delay circuit.

FIG. 1 is a flow chart of a method for determining a delay of a delay circuit. At step 110 a delay circuit is provided. The delay circuit is configured to receive an input signal having an input edge and to provide an output signal having an output edge. The input edge and the output edge are separated by a delay. An edge may occur when the signal changes state from low to high (logic 0 to logic 1) or from high to low (logic 1 to logic 0). For instance, the delay may be a duration between the end of the input pulse and the start of the output pulse. The delay may be a programmable delay.

At step 120 the delay circuit is coupled to a feedback circuit to cause the delay circuit to generate a series of consecutive output pulses. The feedback circuit may be configured to generate a feedback signal as an input to the feedback circuit. The feedback signal has a feedback pulse having a first edge and a second edge causing the series of consecutive output pulses. The first edge of the feedback pulse has a reversed polarity compared to the input edge. For instance if the input edge is a falling edge, then the first edge of the feedback signal is a rising edge, and vice versa.

At step 130 the delay is set to a first delay value and a first period of output pulses is measured. At step 140 the delay is set to a second delay value and a second period of output pulses is measured. At step 150 the delay is calculated based on a difference between the first period and the second period.

For instance measuring the first and second periods of output pulses may include the steps of setting a target number of output pulses, and counting a first number of reference counts for the target number of output pulses at the first delay value; and then counting a second number of reference counts for the target number of output pulses at the second delay value. So the periods and delays may be provided in units of reference counts from the reference counter.

Figure 2:
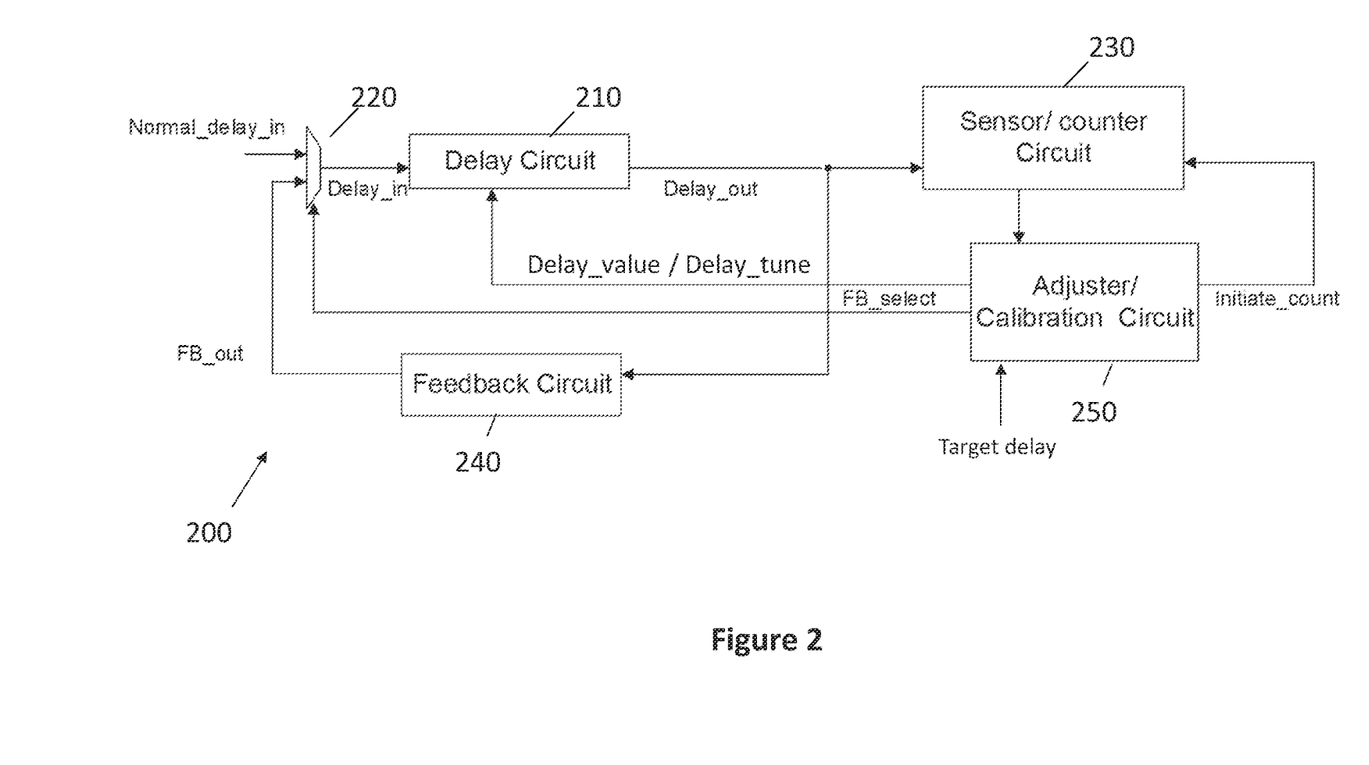
FIG. 2 is a diagram of a circuit for implemented the method of FIG. 1.

FIG. 2 is a diagram of a circuit for implementing the method of FIG. 1. The circuit 200 includes a delay circuit 210 having an input coupled to a multiplexer 220 and an output coupled to a sensor circuit 230. It will be appreciated that the multiplexer 220 may be replaced by a switch or a switch circuit for performing an input signal selection function. The delay circuit 210 may be a programmable delay circuit. A feedback circuit 240 is coupled to the delay circuit 210 in a feedback loop between the output of the delay circuit and the multiplexer 220. The feedback circuit 240 is adapted to generate a feedback signal which when received by the delay circuit 210 causes the delay circuit 210 to generate a series of consecutive output pulses. An adjuster circuit, also referred to as calibration circuit 250, is coupled to the multiplexer 220, the delay circuit 210 and the sensor circuit 230. Together the sensor circuit 230 and the adjuster circuit 250 form a circuit that may be referred to as controller or driver circuit.

The delay circuit 210 may be a circuitry adapted to provide a programmable delay that can be set between a minimum delay value and a maximum delay value. The delay circuit 210 may be implemented in different ways, for instance it may include a ramp generator for generating the delay. In this example the delay may be changed by changing the slope of a ramp signal.

The feedback circuit 240 allows the delay 210 to generate a repeating series of pulses at a given frequency associated with a corresponding period T. In turn, multiple consecutive delays can be measured by the sensor circuit 230, hence improving the accuracy of the delay measurement.

In operation, the multiplexer 220 receives an external signal (Normal_delay_in), a feedback signal (FB_out) from the feedback circuit 240, and a selection signal (FB_select) from the adjuster circuit 250 to pass either the external signal or the feedback signal. So the input signal received by the delay circuit 210 is either the external signal or the feedback signal. When the feedback signal is selected, the delay circuit 210 generates a series of consecutive output pulses. The number of pulses in the series is counted by the sensor circuit 230.

The adjuster 250 is configured to generate a signal (Delay_value) to set the delay of the delay circuit 210 to a target value, and a signal (Delay_tune) to adjust the delay. Depending on the implementation of the delay circuit 210, the signals Delay_value and Delay_tune may be received by the ramp generator to set and adjust the delay.

For instance the adjuster circuit 250 may be used to set the delay to a first delay value and initiate the sensor circuit 230 to perform a series of measurements. A target number N of output pulses is set, and the sensor circuit is used to count a first number of reference counts for the target number N of output pulses at the first delay value. Then the sensor circuit is used to count a second number of reference counts for the target number N of output pulses at the second delay value.

The adjuster circuit 250 receives the number of reference counts from the sensor circuit 230 and performs various calculations. For instance the adjuster circuit may calculate the first period T1 of the output signal using the first number of reference counts; and the second period T2 of the output signal using the second number of reference counts. The adjuster can then be used to calculate a difference T1-T2 to obtain a difference between the first programmable delay and the second programmable delay.

If the first programmable delay is set to a minimum delay, and the second programmable delay to a maximum delay, then the difference T1-T2 defines a full-scale delay of the delay circuit. The full-scale delay can be compared with a target full-scale delay. The adjuster circuit is also configured to generate a signal (Delay_tune) to adjust the delay. Several sets of measurements can be performed iteratively to calibrate the delay circuit.

For instance a first set of measurement is performed with the Delay_tune signal set to a first value for example "½" to obtain a first value of T1-T2. If the first value T1-T2 is less than the target full-scale delay, then the Delay-tune signal is increased for instance from "½" to "2" and a second set of measurement is performed to obtain a second value of T1-T2. If the second value T1-T2 is less than the target full-scale delay, then Delay-tune signal is increased further. Similarly if the second value T1-T2 is greater than the target full-scale delay then the Delay-tune signal is decreased.

By adjusting the Delay-tune signal iteratively, the full-scale delay converges towards its target value. Alternatively a correction coefficient may be calculated to obtain a corrected delay value. Then the delay is set to the corrected delay value.

Figure 3:
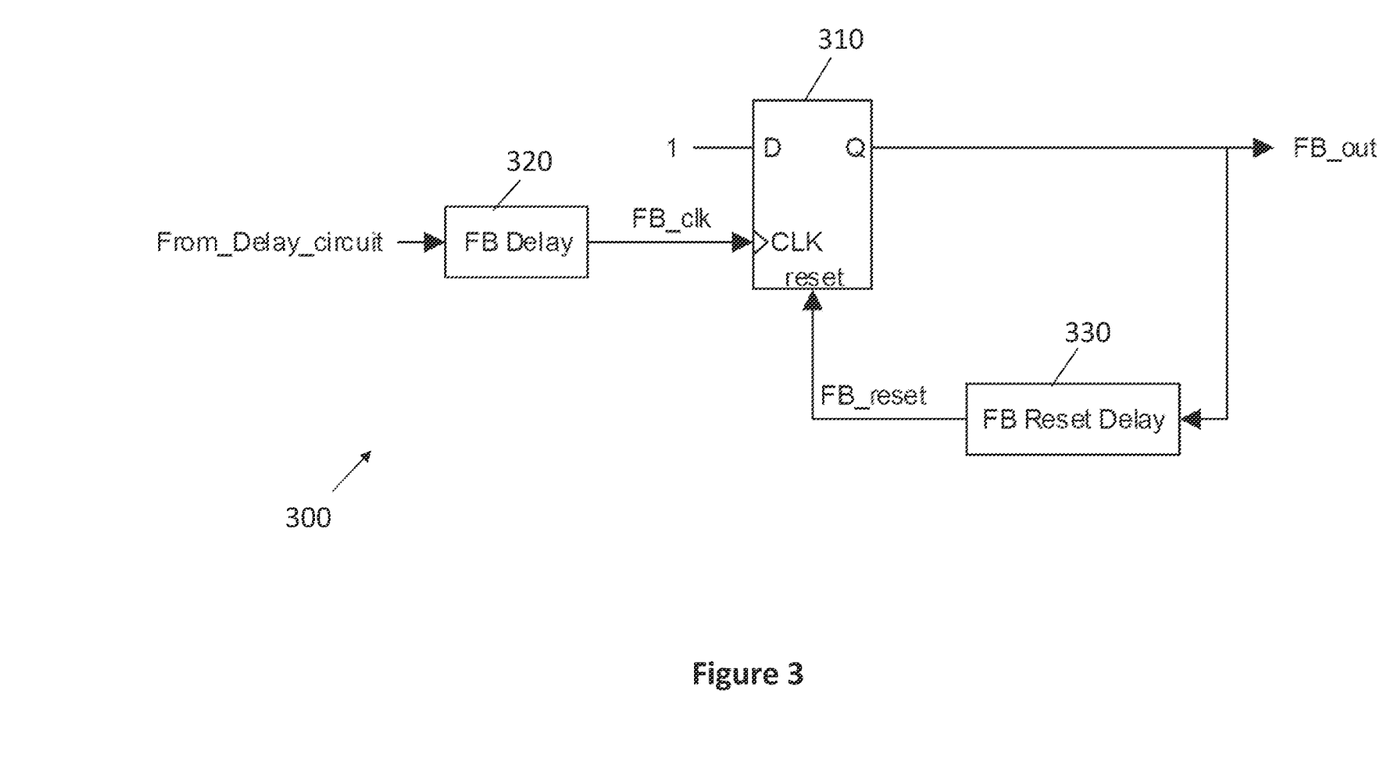
FIG. 3 is a diagram of an exemplary feedback circuit.

FIG. 3 is a diagram of an exemplary feedback circuit for use in the circuit of FIG. 2. The feedback circuit 300 includes a memory device such as a D-flip flop 310 coupled to a first delay (FB Delay) 320 and a second delay (FB Reset Delay) 330. The first delay 320 has an input for receiving the output (Delay_out) from the delay circuit 210 and an output for providing a clock signal (FB_clock). The The D-flip flop 310 has a data input D for receiving a logic signal, a clock input for receiving the clock signal (FB_clk) from the first delay 320, a reset input for receiving a reset signal (FB_reset) from the second delay 330, and an output Q coupled to the second delay 330 in a feedback loop. The output Q provides a feedback signal (FB_out) to the multiplexer 220 and to the second delay 330.

The output of the delay circuit is received by 320. The rising edge is first delayed by the first delay 320. The first delay 320 sets the minimum period of oscillation. Since the Data input of the Dynamic Flip Flop (DFF) 310 is a logic "1", a rising edge on the clock input of the DFF causes the Q output of the DFF to go to a logic "1". The second delay 330 is a delay in the reset path of the DFF that clears the DFF back to a logic "0", effectively making a one-shot active high pulse, of the width of the second delay 330, every time the DFF 310 is clocked. Simple logic can be added to initiate the sequence. For instance an OR gate may be added at the output of the first delay 320. In this case the OR gate has a first input for receiving the signal FB_clk and a second input for receiving an initialisation signal and an output coupled to the clock input of 310.

Figure 4:
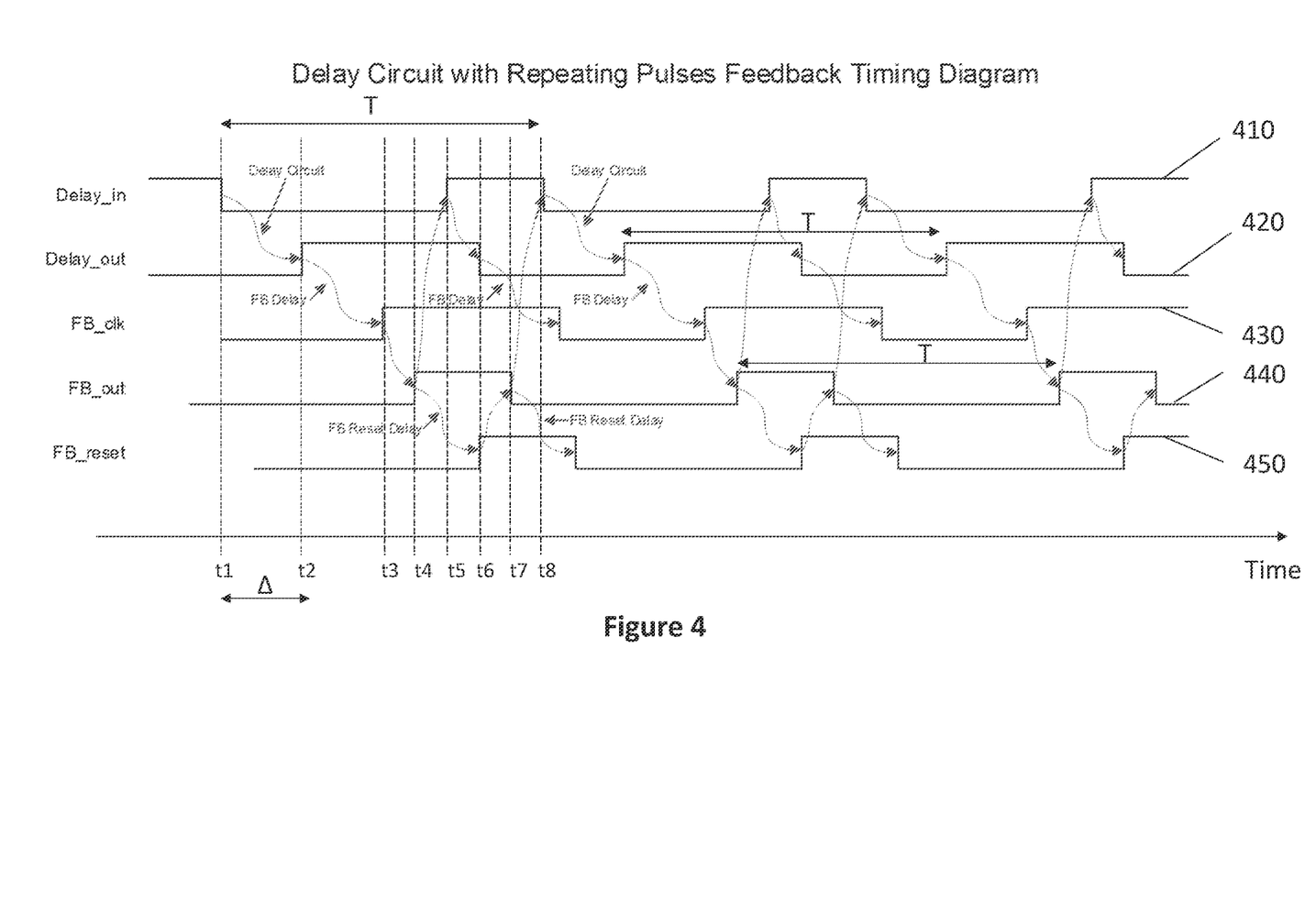
FIG. 4 is a timing diagram illustrating the operation of the feedback circuit of FIG. 3.

FIG. 4 is a timing diagram illustrating the operation of the feedback circuit of FIG. 3 coupled to the delay circuit of FIG. 2. FIG. 4 shows the input delay signal (Delay_in) 410 provided by the multiplexer 220, the output delay signal (Delay_out) 420 provided by the delay circuit 210, the clock signal (FB_clock) 430 provided by the first delay 320, the output signal (FB_out) 440 provided by the D-flip flop 310, and the reset signal (FB_reset) 450 provided by the second delay 330. The arrows represent a causality triggered by the rising edge or falling edge of a logic signal.

In operation, the delay circuit 210 receives the input signal 410 having an input edge shown at time t1. As the circuits operates multiple input pulses are formed with a period T. The circuit 210 then outputs the signal 420 having multiple output pulses with the same period T. The pulses are defined by the on-time of the signal, when the signal is high (logic 1). The period T is the same for the signals 410, 420, 430, 440 and 450.

The feedback circuit 240 generates the feedback signal 440 with multiple feedback pulses with the same period T. This causes the delay circuit 210 to generate multiple consecutive output pulses.

At time t1, the input signal 410 goes low and at time t2, the output signal 420 goes from low to high. The duration A between the times t1 and t2 represent the delay of the delay circuit. So the delay circuit 210 starts to delay when its input goes to a logic "0", and its output transitions to a logic "1" after said delay.

At time t3, the clock signal 430 goes high. This triggers the generation of a feedback output pulse (440 goes from low to high) at time t4. In turn a new input pulse is generated at time t5 (410 goes from low to high) and a reset pulse is created at time t6 (450 goes from low to high). So at time t4 the rising edge of the output signal (FB_out) 440 causes the rising edge of the signal 410 at time t5.

At time t7, the feedback signal 440 goes low. This triggers 410 to go low at time t8. So at time t7 the falling edge of the output signal (FB_out) 440 causes the falling edge of the signal 410 at time t8. A new cycle of pulses then starts again.

When the delay circuit 210 transitions from a logic "0" to a logic "1" (see time t2), the feedback circuit 240 sends an active high pulse to the delay circuit 210 (see time t4), which causes the delay circuit to reset, and transition its output back to a logic "0" (see time t6) shortly after the input (Delay_in) goes from "0" to logic "1" (at time t5).

When the active high pulse from the feedback circuit 240 goes back to a logic "0", (see time t7) the delay circuit 210 starts its delay (at time t8), which eventually results in its output going to a logic "1", and restarting the process.

So the feedback signal 440 is formed on consecutive feedback pulses. A feedback pulse has a first edge (see time t4) and a second edge (see time t7) causing the series of consecutive output pulses. The first edge of the feedback pulse has a reversed polarity compared to the input edge of the input signal 410 (see time t1).

It will be appreciated that the polarity of the signals (from low to high for a rising edge or high to low for a falling edge) illustrated in FIG. 4 may be reversed.

The period T of the repeating pulses, also referred to as oscillation period, contains the delay of the circuit under test, and additional delays. All the delays, apart from the delay $\Delta$ between the times t1 and t2 are constant. By changing the delay $\Delta$, the period T also changes. The oscillation period T is equal to the sum of several delays, that include the delay through the multiplexer 220, the delay of the delay circuit 210, the input delay of the first delay 320 and the delay of the second delay 330 (which corresponds to the time during which the feedback circuit output is high). By measuring the period T, and subtracting the fixed delays, the delay of the circuit 210 under test can be obtained.

Frequency measurements can be performed by counting the number of clock periods of a known clock for a fixed number of periods of the circuit under test. By measuring many periods of the repeating pulses, the accuracy of the measurement is improved.

The time error of the edges of any of the internal periods does not affect the measurement, and only the time error of the first and last edges impacts the measurement error. For instance, by measuring 1000 periods, the error of the first and last edges are only 1 out of 1000 each, and therefore reduced by 1000 times, each.

Like the direct measurement approach, there is still an error due to the integer counting of the known clock of +/−1 period of the known clock, but that error is now reduced, due to measuring multiple periods of the circuit under test. By measuring 1000 periods, the known clock period integer count error is now just +/−1 for the entire 1000 periods of the circuit under test, and therefore is reduced by a factor 1000.

Using a two-pass test, and then taking the difference between these two measurements can be used to isolate the delay of the circuit under test, as long as the other delays are the same for the two passes. The only delay in the circuit that is affected by the programming value, is the delay of the circuit under test. For a programmable delay, a two-pass test is accomplished by measuring the repeating pulses period with two different programmable delay values.

Below is an example calculation of a programmable delay.

The measured period for a programmable delay value X referred to as T(X), and the measured period for a programmable delay value Y referred to as T(Y), are expressed as follows:

$$T(X) = \text{fixed\_delay\_multiplexer} + \text{fixed\_delay\_circuit\_under\_test} + \text{programmable\_delay\_circuit\_under\_test}(X) + \text{fixed\_delay\_feedback\_circuit}$$

$$T(Y) = \text{fixed\_delay\_multiplexer} + \text{fixed\_delay\_circuit\_under\_test} + \text{programmable\_delay\_circuit\_under\_test}(Y) + \text{fixed\_delay\_feedback\_circuit}$$

Consequently, the difference between the two measured period is:

$$T(X) - T(Y) = \text{programmable\_delay\_circuit\_under\_test}(Y) - \text{programmable\_delay\_circuit\_under\_test}(X)$$

By setting Y=MAX and X=MIN, then the difference in the two pass measurements is the full scale delay of the circuit under test.

$$T(\text{MIN}) - T(\text{MAX}) = \Delta(\text{MIN}) - \Delta(\text{MAX}), \text{ so that if } \Delta(\text{MIN}) = 0, \text{then}$$

$$T(\text{MAX}) - T(\text{MIN}) = \Delta(\text{MAX})$$

For instance, MIN=0 and MAX=100.

The average unit Delay may be expressed as T(MAX)−T(MIN)/number of delay value units.

More generally, $T(\text{MIN}) - T(Z) = \Delta(\text{MIN}) - \Delta(Z)$, so that if $\Delta(\text{MIN}) = 0$, then $T(Z) - T(\text{MIN}) = \Delta(Z)$, in which Z may be selected to take any value between (and equal to) the minimum delay MIN and the maximum delay MAX so that MIN≤Z MAX. It is therefore possible to calculate each unit delay individually.

Figure 5:
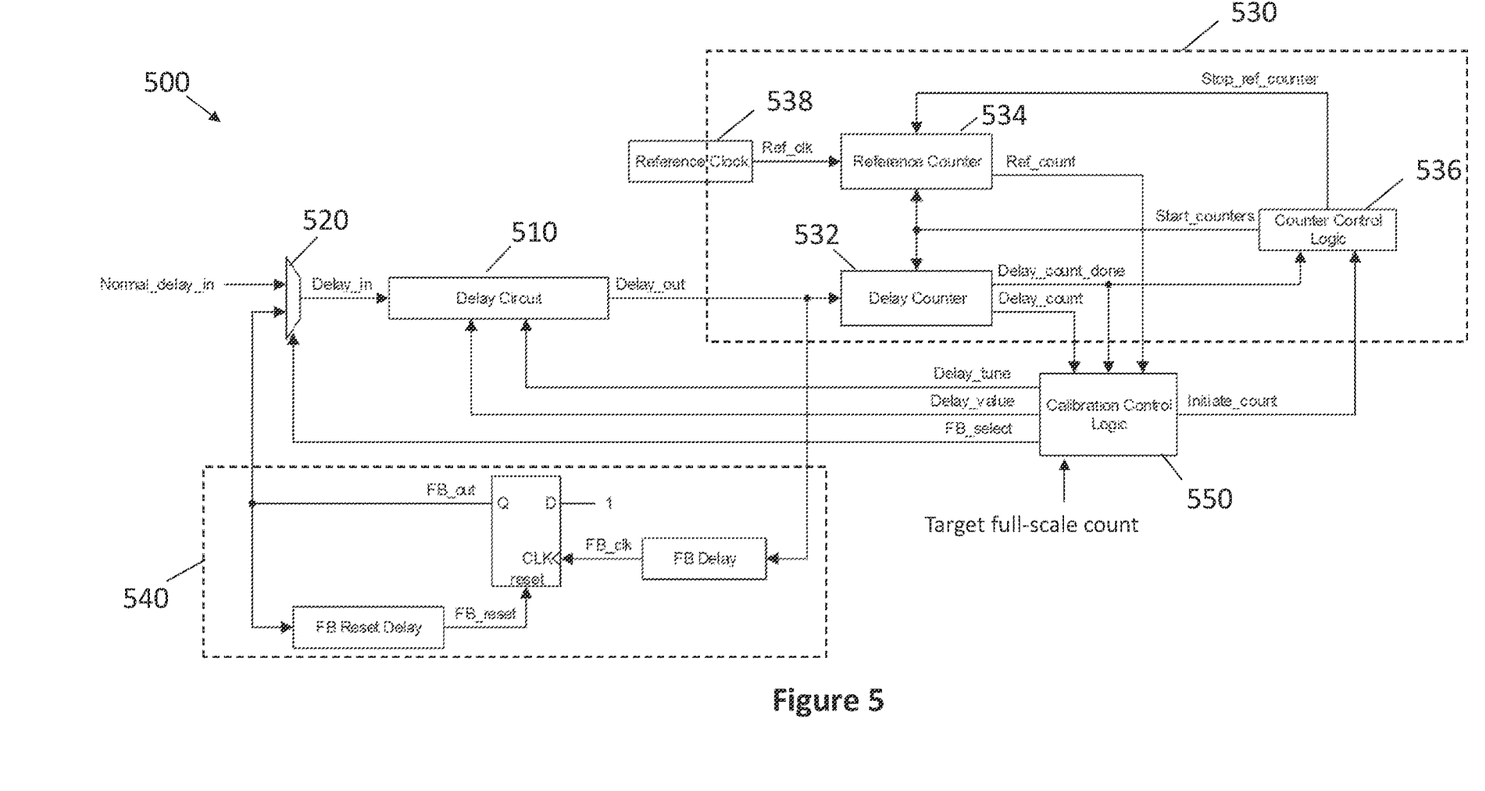
FIG. 5 is an exemplary implementation of the circuit of FIG. 2.

FIG. 5 is an exemplary implementation of the circuit of FIG. 2. The circuit 500 includes a delay circuit 510 having an input coupled to a multiplexer 520 and an output coupled to a sensor circuit 530. A feedback circuit 540 is coupled to the delay circuit 510 in a feedback loop between the output of the delay circuit and the multiplexer 520. An adjuster circuit 540 is provided to adjust the delay circuit 510.

In this example the feedback circuit 540 is implemented like in FIG. 3. The sensor circuit 530 includes a first counter also referred to a delay counter 532, and a second counter also referred to as reference counter 534. A controller, also referred to as counter control logic 536, is provided to control the first and second counters. The reference counter 534 is coupled to a reference clock generator 538 providing a reference clock signal Ref_clk.

The adjuster circuit, also referred to as calibration control logic 550 is coupled to the first and second counters 532, 534, the controller 536, the delay circuit 510, and the multiplexer 520.

The adjuster circuit 550 is configured to generate several signals. The adjuster circuit 550 generates and sends a selection signal FB_select to the multiplexer 520. When the FB_select changes states, for instance from low to high, the output signal FB_out generated by the feedback circuit 540 is selected by the multiplexer 520.

The adjuster circuit 550 is also configured to generate a signal Delay_value to set the delay of the delay circuit 510 to a target value. For instance the Delay_value signal may be used to set the delay to a minimum delay value or a maximum delay value.

The adjuster circuit 550 is also configured to generate and send a signal Initiate_count to controller 536. When the controller 536 receives the Initiate_count signal the controller 536 resets the first and second counters 532 and 534 to perform a measurement of the output of the delay circuit 510.

The circuit 550 may be implemented in different ways. For instance the circuit 550 may be a logic circuit or a processor configured to execute a software code. The control logic circuit 550 may be a digital state machine, in which the logic moves from one state to another state based on the inputs. The digital state machine can be implemented using logic gates, or a processor and a software state machine.

In operation the adjuster circuit 550 sets the delay of the delay circuit 510 to a target value using the Delay_value signal. The delay may comprise a fixed delay and a programmable delay. The delay is set to a first value. In this example the first value is a minimum value and the adjuster 550 sends the selection signal (FB_select) to the multiplexer 520 to select the signal (FB_out) from the feedback circuit 540. In turn, the delay circuit 510 provides a series of consecutive output pulses with a first period T1. The adjuster 550 also sends a command signal (Initate_count) to the controller 536 to start a measurement. The controller 536 sends a start signal (Start_counters) to both the Delay Counter 532 and the Reference Counter 534 to clear their old counts and start new counts.

The Delay Counter 532 counts a fixed number of output pulses from the output signal Delay_out, and then generates an end signal (Delay_count_done) and stops counting. For instance the number of output pulses to be counted by the delay counter 532 may be a pre-defined or target number N. For instance N may be set to 1000.

The controller 536 receives and end signal (Delay_count_done) from the delay counter 532 and generates a stop signal (Stop_ref_counter) to stop the Reference Counter 534, which then stop counting.

Upon receipt of the Delay_count_done signal, the adjuster circuit 550 loads the number of counts values Ref_count and Delay_count from the reference counter 534 and the delay counter 532, respectively.

The adjuster circuit 550 then sets the delay to a second value. In this example the second value is a maximum value. In turn, the delay circuit 510 provides a series of consecutive output pulses with a second period T2.

The adjuster circuit 550 sends the Initiate_count signal to the controller 536 to reset the first and second counters 532 and 534 and to perform another measurement of the output of the delay circuit 510, now using the second delay value. The controller 536 sends the signal Start_counters to both the Delay Counter 532 and the Reference Counter 534 to clear their old counts, and start new counts.

After a fixed number of Delay_out counts, the delay counter 532 generates the Delay_count_done signal and stops counting. The controller 536 senses the Delay_count_done signal, and generates the Stop_ref_counter which tells the Reference Counter 534 to stop counting. The adjuster circuit 550 senses the Delay_count_done signal, and loads the number of counts values Ref_count and Delay_count from the two counters respectively.

The adjuster circuit 550 then uses the two number of counts Ref_count_min and Ref_count_max obtained from the reference counter 534 with the minimum and maximum Delay_value measurements, respectively, to calculate the first period T1, and the second period T2 of the output signal.

The adjuster 550 calculates a difference between the first period T1 and the second period T2 to obtain a difference between the first programmable delay and the second programmable delay.

The difference between the first programmable delay and the second programmable delay defines a full-scale delay of the delay circuit, also referred to as full-scale range. The full-scale delay is then compared with a target full-scale delay. The difference between the full-scale delay and the target value is then reduced.

If the full-scale range of the Delay Circuit 510 is too high, the adjuster circuit 550 reduces the Delay_tune value to reduce the full-scale range. Similarly, if the full-scale range of the Delay Circuit 510 is too low, the adjuster circuit 550 increases the Delay_tune value to increase the full-scale range. The full-scale range is adjusted iteratively until the delay_tune has reached its best resolution.

Different calibration procedures can be envisaged. The following is the procedure for calibrating the full-scale range of the Delay Circuit, so that the full-scale is equal to the period of a goal clock defined as Tgoal.

The following terms are defined below:
Tref_clock is the period of the reference clock generated by 538.

$$Tref\_clock = M*Tgoal.$$

N is The number of consecutive periods of the Delay_out signal that are counted by the Delay Counter 532.

RCmax is the final count value of the Reference Counter 534 when the "Delay_value" is set to the maximum.

RCmin is the final count value of the Reference Counter 543 when the "Delay_value" is set to the minimum.

Dfixed is the constant fixed delay between the times t2 and t8. This is independent on the Delay_tune and Delay_value signals.

Delay_circuitmax is the delay of the Delay Circuit 510 when the Delay_value is set to the maximum.

Delay_circuitmin is the delay of the Delay Circuit 510 when the Delay_value is set to the minimum.

Target_fullscale_count is the target fullscale count of RCmax−RCmin used to identify the optimal calibration delta count.

During measurement the reference counter 532 counts for the same duration in time as the Delay_counter 532. This is not the same number of counts, but the same time.

The following relationships apply:

$$N*(Delay\_circuitmax+Dfixed)=RCmax*Tref\_clock$$

$$N*(Delay\_circuitmin+Dfixed)=RCmin*Tref\_clock$$

When the target fullscale is reached, $$Delay\_circuitmax-Delay\_circuitmin=Tgoal.$$

The calculation of the target_fullscale_count is as follows:

$$N*(Delay\_circuitmax+Dfixed)-N*(Delay\_circuitmin+Dfixed)=RCmin*Tref\_clock-RCmin*Tref\_clock$$

$$N*[(Delay\_circuitmax+Dfixed)-(Delay\_circuitmin+Dfixed)]=Tref\_clock*[RCmax-RCmin]$$

$$N*[Delay\_circuitmax-Delay\_circuitmin]=M*Tgoal*[RCmax-RCmin]$$

Set Delay_circuitmax−Delay_circuitmin=Tgoal and reduce the equation down to $$N=M*[RCmax-RCmin]$$

$$N=M*Target\_fullscale\_count$$

$$Target\_fullscale\_count=N/M$$

For the full scale calibration procedure the following steps may be implemented:
1. Set the "FB_select" to choose the "FB_out" path
2. Set the "Delay_tune" to ½ the maximum value
3. Set the "Delay_value" to the minimum value
4. Generate the "initiate_count" to clear the counters, and start a new count
5. Wait for the "Delay_count_done"
6. Store the "Ref_count" value as RCmin
7. Set the "Delay_value" to the maximum value
8. Generate the "initiate_count" to clear the counters, and start a new count
9. Wait for the "Delay_count_done"
10. Store the "Ref_count" value as RCmax
11. Calculate the fullscale count of the "Reference Counter" as RCmax−RCmin
12. Compare the RCmax−RCmin to the Target_fullscale_count and determine if the "Delay_tune" needs to increase or decrease, and then set the "Delay_tune" halfway between the current value and the upper or lower range ie to ¾ or ¼. This is a binary search algorithm.
13. If the "delay_tune" is not at the smallest resolution setting (least significant bit in binary search), then go back to step 3.
14. If the "delay_tune" is at the smallest resolution setting (least significant bit in binary search), then the calibration is finished, so set the "FB_select" to select the "Normal_delay_in" path. The fullscale delay of the "Delay Circuit" (Delay_circuitmax−Delay_circuitmin is now as close as possible to the period of the goal clock (Tgoal).

Alternatively one can calculate a full-scale correction coefficient by implementing the following steps:
1. Set the "FB_select" to choose the "FB_out" path
2. Set the "Delay_tune" to the nominal value
3. Set the "Delay_value" to the minimum value 4. Generate the "initiate_count" to clear the counters, and start a new count
5. Wait for the "Delay_count_done"
6. Store the "Ref_count" value as RCmin
7. Set the "Delay_value" to the maximum value
8. Generate the "initiate_count" to clear the counters, and start a new count
9. Wait for the "Delay_count_done"
10. Store the "Ref_count" value as RCmax
11. Calculate the fullscale count of the "Reference Counter" as RCmax−RCmin
12. Calculate the "Fullscale_correction_coeficient" of the goal period to the actual "Delay Circuit" fullscale as (Target_fullscale_count/RCmax−RCmin)
13. Set the "FB_select" to select the "Normal_delay_in" path.
14. Use a multiplier to multiply the normal mode "Delay_value" by the "Fullscale_correction_coeficient" to compensate for the real delay of the "Delay Circuit" with regards to the ideal fullscale delay of Tgoal.

The proposed circuit and method can be used for various applications. For instance, the circuit described with respect to FIGS. 2-5 may be used with a fractional clock divider to correct or reduce its jitter. This may be achieved by ensuring that the full-scale of the programmable delay is equal to one period of the input clock of the fractional divider.

Figure 6:
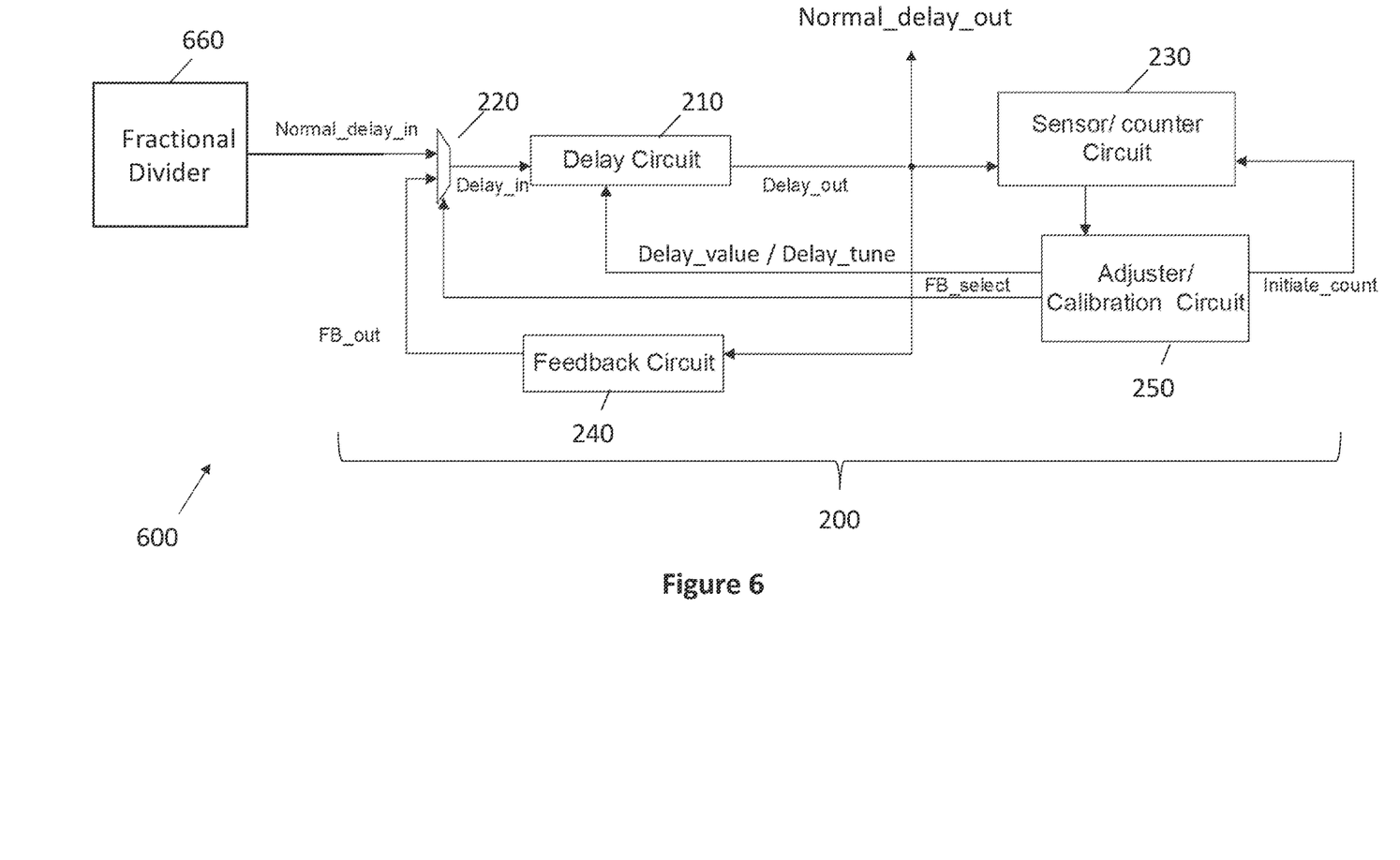
FIG. 6 is a diagram of a fractional divider coupled to the circuit of FIG. 2.

FIG. 6, is a diagram of a fractional divider coupled to the circuit of FIG. 2. A fractional divider 660 is coupled to a circuit 200 as described in FIG. 2. In operation the fractional divider 660 generates a signal (Normal_delay_in) for the multiplexer 220.

For instance the full-scale measurement can be used as the input to a circuit that adjusts the full-scale delay, until it is correct, and therefore calibrate the programmable delay.

A fractional divider includes an integer divider that can divide, at a minimum, by a number X as well as X+1. To generate a divide value of X+a fraction, the divider alternates between dividing by X and X+1, so that on average it is dividing by X+ fraction.

For example, for a divide of 10.25, the divider would have a divide value pattern of 10, 10, 10, 11 and then repeat. For a total of 4 cycles, the divider divides by 41, giving it an average divide value of 10.25. The individual periods of the divider are not equally spaced, which is undesirable.

By adding the fraction to an accumulator and using that accumulated fraction to control a programmable delay, after the divider, the divider output can be corrected in time for every equal spacing, not just the average.

For the first divide, the divider divides by 10, and the delay delays by 0.25, for the second divide, the divider divides by another 10, and the delay delays by 0.50, the third divides by 10, and delays by 0.75, and the fourth divides by 11, and delays by 0.00 (rolls over). The resulting periods are as follows: 10+0.25, (10+10)+0.50, (10+10+10)+0.75, (10+10+10+11)+0.00.

The periods 10.25, 20.50, 30.75, 41 are now equally spaced by 10.25 between each output. The jitter is therefore corrected.

In the example of FIG. 6 the normal_delay_in signal would provide the values {10, 10, 10, 11} and the normal_delay_out signal would provide the values {10.25, 20.50, 30.75, 41}.

A skilled person will therefore appreciate that variations of the disclosed arrangements are possible without departing from the disclosure. Accordingly, the above description of the specific embodiments is made by way of example only and not for the purposes of limitation. It will be clear to the skilled person that minor modifications may be made without significant changes to the operation described.

The invention claimed is:

1. A method of determining a delay of a delay circuit, the method comprising
providing a delay circuit configured to receive an input signal having an input edge and to provide an output signal having an output edge, wherein the input edge and the output edge are separated by a delay;
coupling the delay circuit to a feedback circuit to cause the delay circuit to generate a series of consecutive output pulses;
setting the delay to a first delay value and measuring a first period of output pulses;
setting the delay to a second delay value and measuring a second period of output pulses; and
calculating the delay based on a difference between the first period and the second period.

2. The method as claimed in claim 1, wherein the feedback circuit is configured to generate a feedback signal as an input to the feedback circuit, wherein the feedback signal has a feedback pulse having a first edge and a second edge causing the series of consecutive output pulses, wherein the first edge of the feedback pulse has a reversed polarity compared to the input edge.

3. The method as claimed in claim 1, wherein measuring the first and second periods of output pulses comprises
setting a target number of output pulses;
counting a first number of reference counts for the target number of output pulses at the first delay value;
counting a second number of reference counts for the target number of output pulses at the second delay value.

4. The method as claimed in claim 1, wherein the first delay value is a minimum delay value and the second delay value is a delay value selected between the minimum delay value and a maximum delay value or equal to the maximum delay value.

5. The method as claimed in claim 4, comprising comparing the calculated delay with a target value to obtain a difference measurement.

6. The method as claimed in claim 4, comprising adjusting the delay iteratively to reduce the difference measurement; or calculating a correction coefficient to obtain a corrected delay value and setting the delay to the corrected delay value.

7. A circuit comprising
a delay circuit configured to receive an input signal having an input edge and to provide an output signal having an output edge, wherein the input edge and the output edge are separated by a delay;
a feedback circuit adapted to cause the delay circuit to generate a series of consecutive output pulses;
and a controller configured to set the delay to a first delay value and measure a first period of output pulses; to set the delay to a second delay value and measure a second period of output pulses; and to calculate the delay based on a difference between the first period and the second period.

8. The circuit as claimed in claim 7, wherein the controller is configured to set a target number of output pulses; count a first number of reference counts for the target number of output pulses at the first delay value; count a second number of reference counts for the target number of output pulses at the second delay value.

9. The circuit as claimed in claim 8, wherein the controller comprises an adjuster circuit and a sensor circuit, the adjuster circuit being configured to set the delay to the first or the second delay value and initiate the sensor circuit to count the first number of reference counts count for the first delay or the second number of reference counts for the second delay.

10. The circuit as claimed in claim 9, wherein the sensor circuit comprises a reference counter and a delay counter coupled to a counter controller; wherein the delay counter is configured to count the target number of output pulses, and wherein the reference counter is configured to provide the first and second number of reference counts.

11. The circuit as claimed in claim 10, wherein the delay counter is configured to count the target number of output pulses and to send an end signal to the counter controller; and wherein upon receipt of the end signal the counter controller is configured to generate a stop signal to stop the reference counter and to send the number of reference count from the reference counter to the adjuster.

12. The circuit as claimed in claim 9, wherein the adjuster circuit comprises a calculator configured to calculate the first period of the output signal using the first number of reference counts; and to calculate the second period of the output signal using the second number of reference counts; and to calculate the difference between the first period and the second period.

13. The circuit as claimed in claim 7, wherein the first delay value is a minimum delay value and the second delay value is a delay value selected between the minimum delay value and a maximum delay value or equal to the maximum delay value.

14. The circuit as claimed in claim 13, wherein the calculator is configured to compare the calculated delay with a target value to obtain a difference measurement.

15. The circuit as claimed in claim 14, wherein the adjuster circuit is configured to generate an adjustment signal to adjust the delay, and to adjust the delay iteratively to reduce the difference measurement.

16. The circuit as claimed in claim 14, wherein the adjustor circuit is configured to calculate a correction coefficient to obtain a corrected delay value and to set the delay to the corrected delay value.

17. The circuit as claimed in claim 7, wherein the feedback circuit is configured to provide a feedback signal based on the output signal, the circuit comprising a selector configured to select the input signal between an external signal and the feedback signal.

18. The circuit as claimed in claim 17, wherein the feedback circuit comprises a memory device coupled to the delay circuit in a feedback loop.

19. The circuit as claimed in claim 18, wherein the feedback circuit comprises a flip-flop having a reset input coupled to the selector via a first delay, a clock input coupled to the output of the delay circuit via a second delay, and an output coupled to selector.

20. The circuit as claimed in claim 17, comprising a fractional divider configured to provide the external signal to the selector.

* * * * *